(12) United States Patent
Kengeri et al.

(10) Patent No.: US 6,343,029 B1
(45) Date of Patent: Jan. 29, 2002

(54) CHARGE SHARED MATCH LINE DIFFERENTIAL GENERATION FOR CAM

(75) Inventors: Subramani Kengeri, San Jose; Steve Lim, Cupertino, both of CA (US)

(73) Assignee: Silicon Access Networks, Inc., San Jose, CA (US)

( * ) Notice: Subject to any disclaimer, the term of this patent is extended or adjusted under 35 U.S.C. 154(b) by 0 days.

(21) Appl. No.: 09/782,576

(22) Filed: Feb. 13, 2001

(51) Int. Cl.$^7$ ................................................ G11C 15/00
(52) U.S. Cl. ........................................ 365/49; 365/203
(58) Field of Search ................................... 365/49, 203

(56) References Cited

U.S. PATENT DOCUMENTS

| 5,617,348 A | * | 4/1997 | Maguire | ........................ | 365/49 |
| 6,181,591 B1 | * | 1/2001 | Miyatake et al. | ............. | 365/49 |
| 6,240,001 B1 | * | 5/2001 | Ross | ............................ | 365/49 |

* cited by examiner

Primary Examiner—Trong Phan
(74) Attorney, Agent, or Firm—Fernandez & Associates

(57) ABSTRACT

A content addressable memory (CAM) with built-in power saving management. The CAM includes a comparator circuit region that is coupled to a match line (ML) as well as a swing line (SL). The comparator circuit region is coupled to CAM cells. The comparator region is adapted for comparing match data with stored data within the CAM cells. The ML has its ML voltage level pre-charged to a pre-charge voltage level (Vc). Additionally, the SL is pre-charged to ground. In turn, in response to a data mismatch detected by the comparator, the ML voltage level drops from Vc by a ML voltage swing (Vswing) while the SL charge shares with the Ml. Advantageously, in response to this data mismatch, the SL charge shares with the ML such that Vswing is approximately less or equal to Vc/2. That is, the charge sharing prevents the ML from discharging all the way to ground. Thus, because Vswing is as large as Vc in a conventional CAM whereas Vswing is as large as about Vc/2 in the invention, the invention's Vswing restriction provides significant more power saving.

16 Claims, 5 Drawing Sheets

201

202

CHARGE SHARED MATCH LINE DIFFERENTIAL GENERATION FOR CAM

FIELD OF THE INVENTION

The invention relates to a content addressable memory (CAM), particularly to power consumption management of the CAM.

BACKGROUND

In a conventional CAM, a match line (ML) changes its voltage level to indicate data mismatches. Typically, the ML is pre-charged to a given voltage level Vc. Then, the ML is discharged to ground in response to one or more data mismatches, wherein the voltage level of the ML drops from Vc by an amount referred to as the ML's "voltage swing." In turn, this ML swing is detected by a sense amplifier to indicate the data mismatches. However, the CAM consumes a significant portion of its power to recover from this ML swing such that the ML's voltage level is again restored back to Vc. Moreover, the ML swing increases as the number of data mismatches increases.

Specifically, a ML consumes significant power due to it large voltage swing, high capacitance of CAM cells and high speed of operation. Unfortunately, conventional techniques to reduce power using lower voltage of operation or NAND configuration of CAM cells have limited advantages in term of speed. Moreover, the ML's swing depends on the number of cells causing in parallel a discharge of the ML. As such, even with a minimum number of cells discharging the ML, limiting the ML's swing actually causes a significant speed degradation.

Thus, a need exists for a CAM whose ML power consumption can be reduced. Specifically, a need exists for limiting a CAM's ML swing. A need also exists for limiting the ML swing irrespective of the number of cells discharging the ML in parallel while not causing significant speed degradation.

SUMMARY

The invention is drawn to a content addressable memory (CAM) with built-in power saving management. Specifically, the invention provides a CAM that limits its match line (ML) voltage swing while not causing significant speed degradation. Also, the invention provides a CAM that limits the ML voltage swing irrespective of the number of cells discharging the ML in parallel.

In one embodiment, the CAM includes a comparator circuit region that is coupled to a ML as well as a swing line (SL). The comparator circuit region is also coupled to CAM cells. The comparator region is adapted for comparing match data with stored data within the CAM cells. The ML has its ML voltage level pre-charged to a certain voltage level (Vc). Additionally, the SL is pre-charged to ground. In turn, in response to a data mismatch detected by the comparator, the ML voltage level drops from Vc by a ML voltage swing (Vswing). In response to this data mismatch, the SL charge shares with the ML such that this Vswing is less or equal to Vc/2. That is, the charge sharing prevents the ML from discharging all the way to ground. Thus, Vswing is as large as about Vc/2 in the invention, whereas Vswing is as large as V in a conventional CAM. Thus, in comparison to a conventional CAM, the present invention requires less than half of the power required to recover from a voltage swing of the ML. As such, advantageously, the invention's Vswing restriction (through charge sharing technique) provides significant power saving in comparison to a conventional CAM.

These and other objects and advantages of the present invention will no doubt become obvious to those of ordinary skill in the art after having read the following detailed description of the preferred embodiments which are illustrated in the various figures.

BRIEF DESCRIPTION OF THE FIGURES

The accompanying drawings which are incorporated in and form a part of this specification, illustrate embodiments of the invention and together with the description, serve to explain the principles of the invention.

DETAILED DESCRIPTION

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
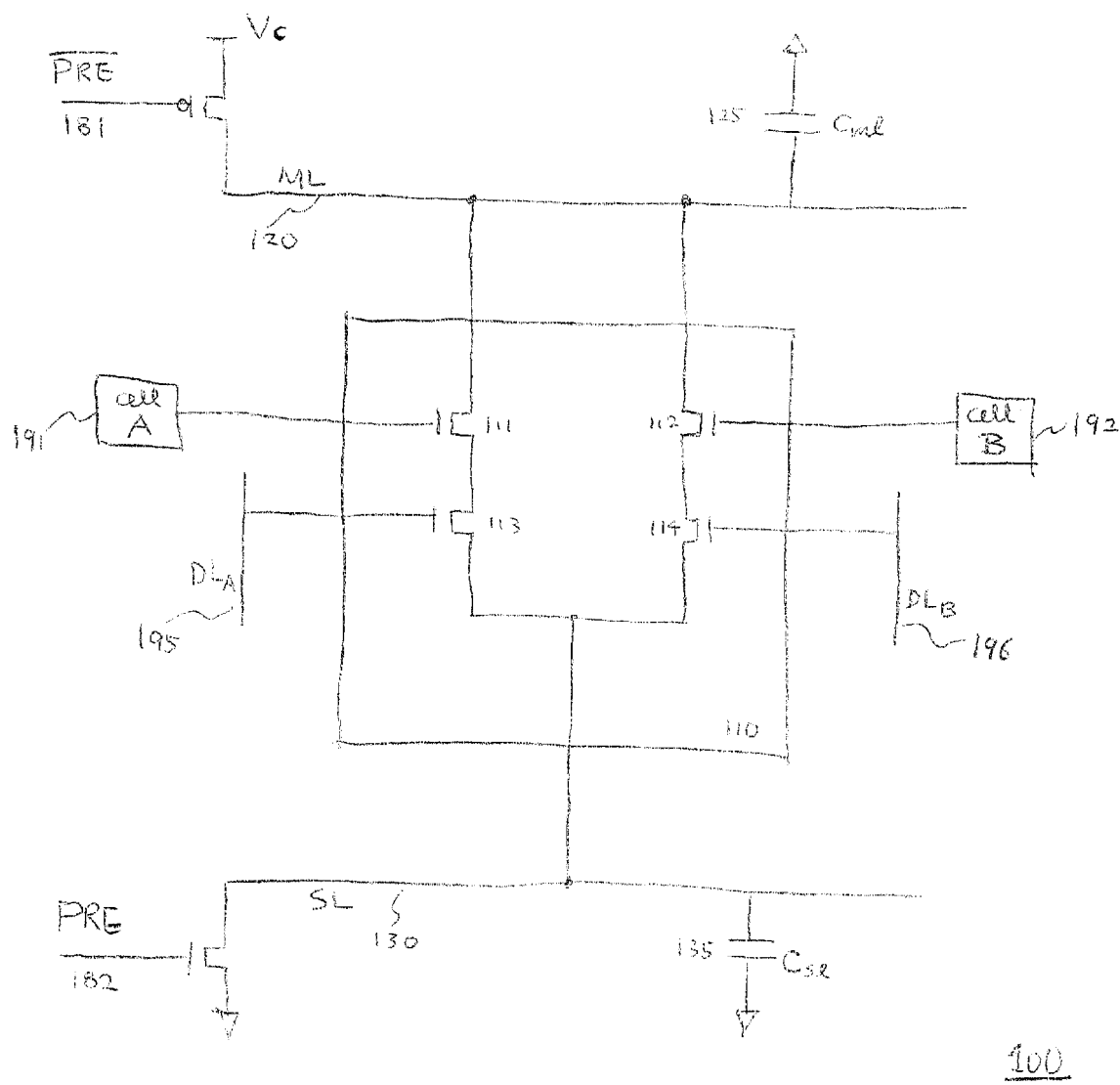
FIG. 1 shows a content addressable memory (CAM) in accordance with one embodiment of the invention.

Referring now to FIG. 1, a circuit diagram of a content addressable memory (CAM) 100 is shown in accordance with one embodiment of the invention. CAM 100 includes a comparator circuit region 110 that is coupled to a match line (ML) 120 as well as a swing line (SL) 130.

Continuing, with FIG. 1, comparator circuit region 110 is coupled to CAM cells A 191 and B 192 respectively via pass gates 111–112. The match data are provided by data lines (DLs) A 195 and B 196, which are respectively coupled to comparator circuit region 110 via pass gates 113–114. Comparator circuit region 110 is adapted for comparing the match data provided by DL A 195 and B 196 with stored data within the CAM cells A 191 and B 192.

As understood herein, the number of CAM cells coupling to comparator circuit region 110 need not be limited to two as shown in FIG. 1. In another embodiment, more than two CAM cells are coupled to comparator circuit region 110. Also as understood herein, the number of DLs coupled to comparator circuit region 110 need not be limited to two as shown in FIG. 1. In another embodiment, more than two DLs are coupled to comparator circuit region 110.

Referring still to FIG. 1, ML 120 has a capacitance of Cml represented by the capacitance of a capacitor 125. Additionally, ML 120 has its ML voltage level, Vml, pre-charged from a voltage input 181 to a voltage level (Vc). SL 130 has capacitance of Csl represented by the capacitance of a capacitor 135. Additionally, SL 130 is pre-charged by a voltage input 182 to ground. In response to a data mismatch detected by comparator circuit region 110, Vml drops from Vc by an amount referred to as a ML voltage swing (Vswing). Also in response to the data mismatch, SL 130 provides a built-in power management for CAM 100 by reducing Vswing.

Specifically, because a ML in a conventional CAM discharges all the way to ground in response to a data mismatch, Vswing in the conventional CAM is as large as Vc. As such, power is consumed in the conventional CAM by restoring Vml from ground back up to Vc in order to recover from Vswing (=Vc). In contrast, in the present embodiment, SL 130 charge shares with ML 120 such that Vswing is restricted to less or equal to Vc/2. As such, power is consumed in restoring Vml from (Vc−Vswing) back to Vc in order to recover from Vswing (=<Vc/2). Consequently, CAM 100 in the present embodiment consumes approximately half or less power than a conventional CAM in restoring a discharged ML. As an example, power consumption for restoring Vml back to Vc is approximately 4 times less than what is necessary in a conventional CAM because Vswing (the voltage drop ML 120) does not exceed Vc/2, which is half the value for Vswing in the conventional CAM.

Furthermore, continuing with FIG. 1, Vswing depends on the ratio of Cml and Csl. Thus, power and speed trade-off can be fine-toned by adjusting the ratio of Cml and Csl. In the present embodiment, the ratio of Csl to Cml is greater or equal to 1 for ensuring that Vswing does not exceed Vc/2. Moreover, with the share charging between SL 130 and ML 120 in the present embodiment, Vswing has a threshold value that is less or equal to Vc/2 irrespective of multiple data mismatches detected by comparator circuit region 110. As such, advantageously, Vswing is less or equal to Vc/2 irrespective of CAM cells causing ML discharge in parallel.

As understood herein, the invention need not be limited to the matching convention described above. For example, in another embodiment having a different matching convention, ML 120 discharges in response to a data match rather than to a data mismatch. Also as understood herein, Vc does not need to be the supply voltage.

Figure 2A:
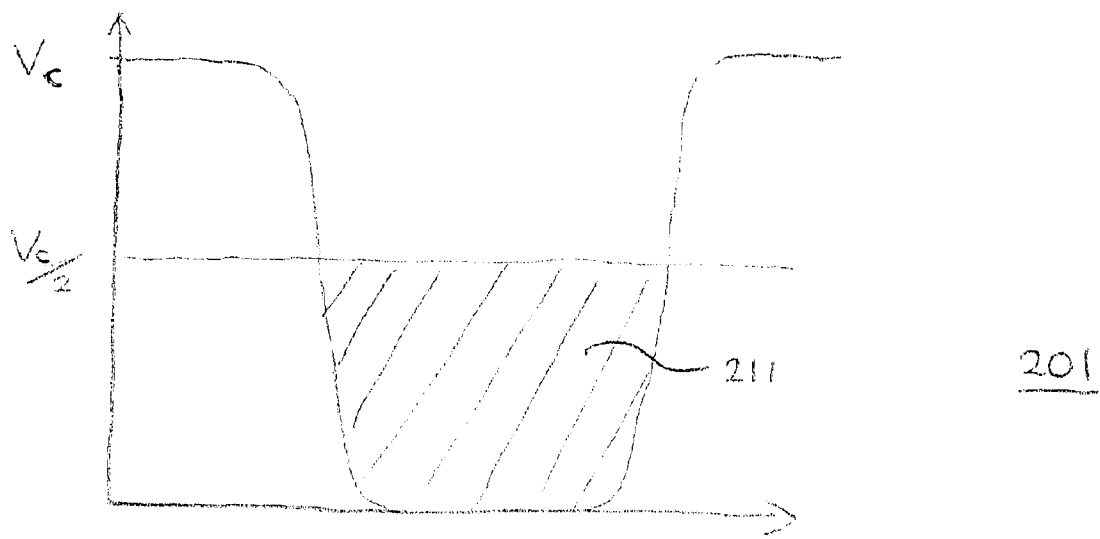
FIG. 2A is a graph (voltage vs. time) profiling a match line's (ML's) voltage variation in time in accordance with one embodiment of the invention shown in FIG. 1.
Figure 2B:
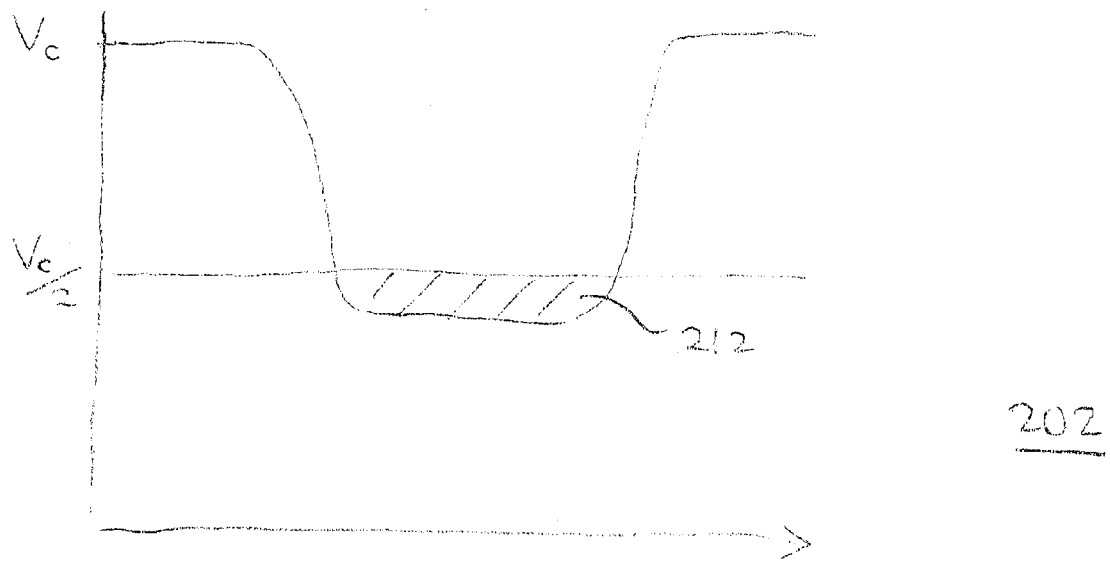
FIG. 2B is a graph (voltage vs. time) profiling a ML's voltage level variation in time in accordance with a conventional CAM.

Referring now to FIGS. 2A and 2B, two graphs 201–202 (voltage vs. time) are shown profiling the voltage level of a ML in two different scenarios. Graph 201 depicts power consumption in restoring the voltage swing of a ML in the present embodiment, whereas graph 202 depicts power consumption in restoring the voltage swing of a ML in a conventional CAM. Moreover, in both graphs 201–202, the pre-charge voltage level for a ML is Vc. Additionally, the ML sensing trip-point is Vc/2 in both graphs 201–202.

Referring first to FIG. 2A, graph 201 shows that a ML's voltage level in the conventional CAM swings all the way passing over the ML sensing trip-point Vc/2 and then down to the ground level before being restored back up to Vc. Shade area 211 indicates power consumption wasted in restoring the voltage level of ML.

In contrast, referring next to FIG. 2B, graph 202 shows that the ML's voltage level drops slightly below the ML sensing trip-point Vc/2, then is restored back to V. Shade area 212 indicates power consumption wasted in restoring the voltage level of ML.

Referring now to both FIGS. 2A and 2B side by side, shade area 212 as shown in FIG. 2B is less than shade area 212 as shown in FIG. 2A, thus highlighting the advantageous power saving provided by the present embodiment of the invention over the conventional CAM.

Figure 3A:
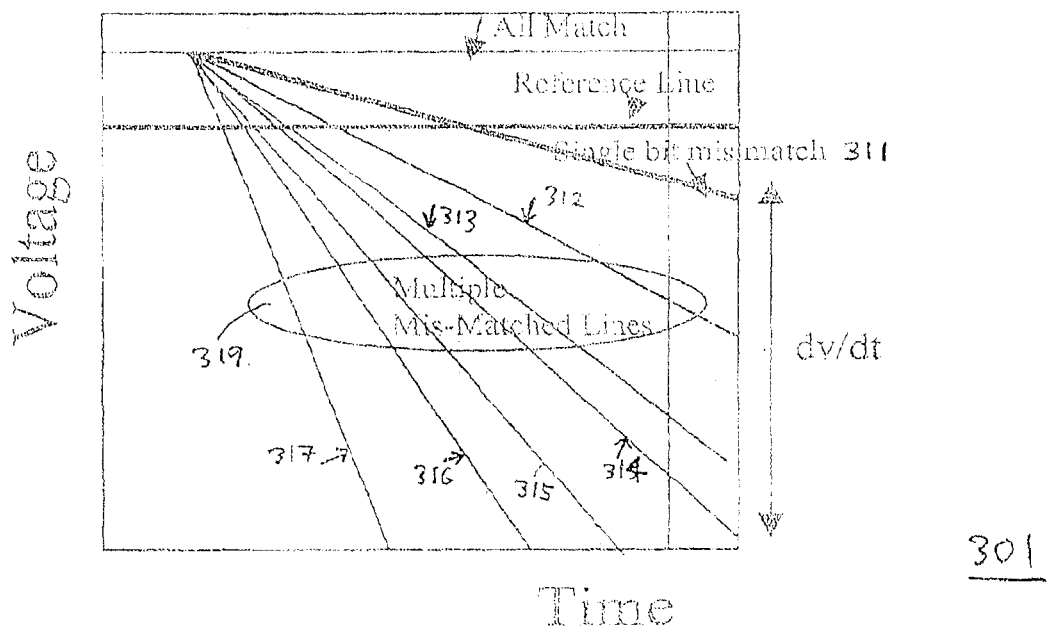
FIG. 3A is a graph (voltage vs. time) depicting how dV/dt varies with respect to the number of CAM cells discharging the ML in parallel in accordance with one embodiment of the invention.
Figure 3B:
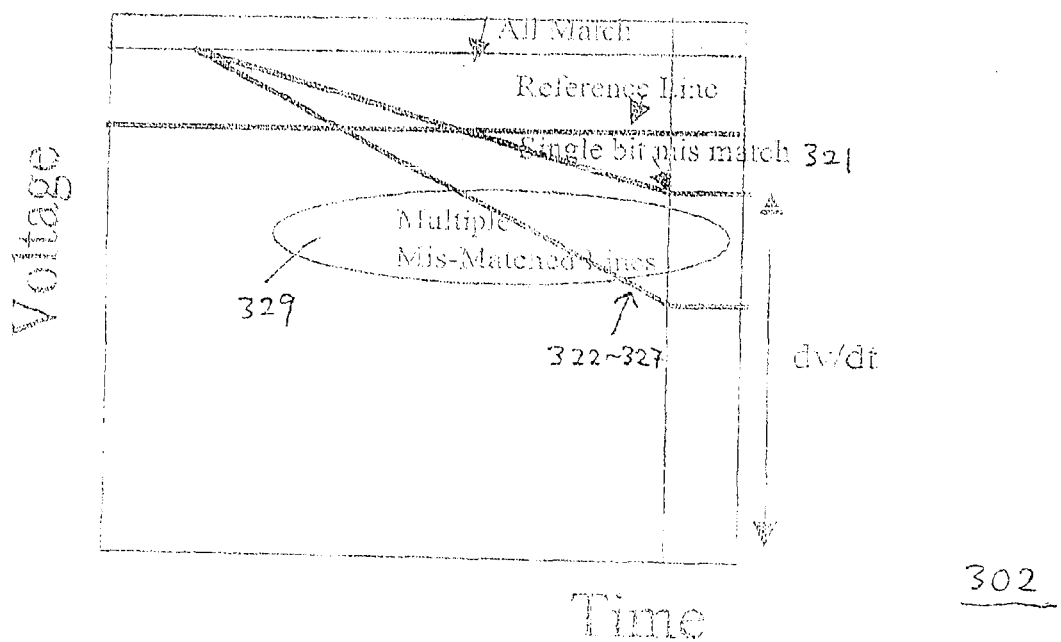
FIG. 3B is a graph (voltage vs. time) depicting how dV/dt varies with respect to the number of CAM cells discharging the ML in parallel in accordance with a conventional CAM.

Referring now to FIGS. 3A and 3B, two graphs 301–302 (voltage vs. time) are shown depicting power consumption dependency (respectively for the invention and a conventional CAM) on the number of data mismatches. Specifically, each of graphs 301–302 depicts how power consumption of a CAM depends on the number of CAM cells that in parallel discharge a ML.

In graph 301 of FIG. 3A, line 311 represents the ML voltage swing in response to a single bit data mismatch. That is, line 311 represents the ML swing in time in response to a single CAM cell discharging the ML. Lines 312–317 in graph region 319 represent the ML voltage swing respectively for the cases of multiple bit data mismatches. As shown, the slope becomes increasingly steeper as the number of data mismatches increases. As such, the slope (dV/dt) of each of lines 311–317 depends on the number of data mismatches because. Consequently, in the conventional CAM, more data mismatches implies more ML voltage swing, thereby necessitating more power consumption to restore the ML's voltage level back to its pre-charged level of Vc.

In contrast, in graph 302 of FIG. 3B, line 321 depicts the ML voltage swing in response to a single bit data mismatch. Lines 322–327, all clustered together in graph region 329 and overlapping, depict the ML voltage swing respectively for the cases of multiple bit data mismatches. As shown, after a certain number of data mismatches, the slope dV/dt does not depend on the number of data mismatches as in a conventional CAM. Consequently, more data mismatches do not necessarily implies more ML voltage swing. Specifically, more data mismatches can only increase the voltage swing up to a saturation level 377. As such, the ML voltage level need not be restored all the way from the ground level, but rather from saturation level 377. Thus, advantageously, the present embodiment consumes less power than a conventional CAM.

Figure 4:
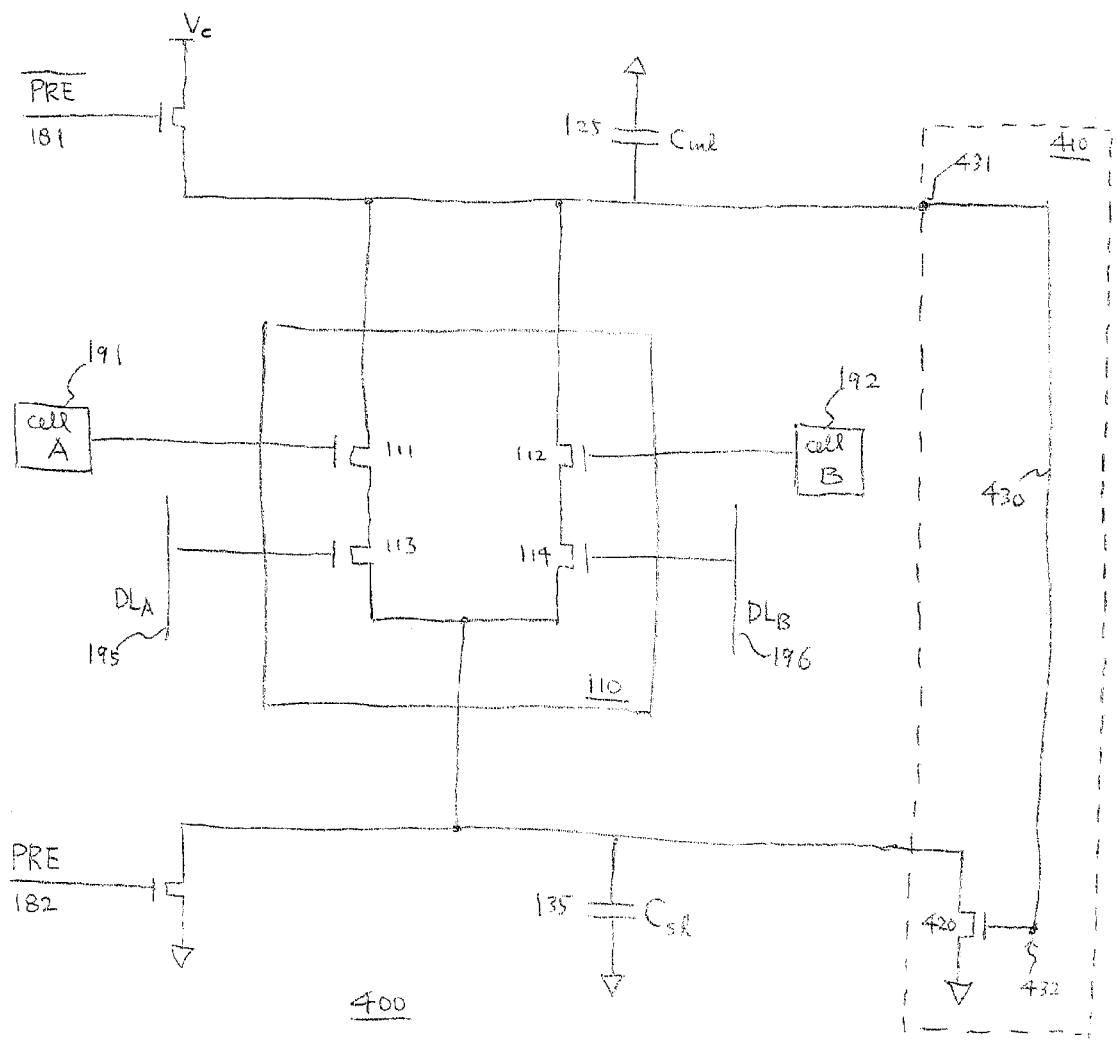
FIG. 4 shows a CAM in accordance with another embodiment of the invention.

Referring now to FIG. 4, a circuit diagram of a CAM 400 is depicted in accordance with another embodiment of the invention. In the present embodiment, CAM 400 comprises a "ML swing smoothing" mechanism 410 in combination with FIG. 1's CAM 100. Specifically, mechanism 410 is adapted to prevent an abrupt ML swing, thus smoothing the ML swing. As shown in FIG. 4, mechanism 410 couples ML 120 to SL 130. As such, ML 120 and SL 130 are not only coupled through comparator circuit region 110, but also coupled through mechanism 410.

As understood herein, the number of CAM cells coupling to comparator circuit region 110 need not be limited to two as shown in FIG. 4. In another embodiment, more than two CAM cells are coupled to comparator circuit region 110. Also as understood herein, the number of DLs coupled to comparator circuit region 110 need not be limited to two as shown in FIG. 4. In another embodiment, more than two DLs are coupled to comparator circuit region 110.

Continuing with FIG. 4, more specifically, mechanism 410 includes a pass gate 420 and high resistance line 430 having two terminals 431–432. Pass gate 420 is coupled to SL 130 to regulate current flow on SL 130. Terminal 431 of high resistance line 430 is coupled to ML 120. Terminal 432 is coupled to pass gate 420. Functionally, voltage level of ML 120 regulates pass gate 430. In turn, pass gate 430 regulates current on SL 130 by allowing less current to ground to decrease (smooth) the voltage dropping rate of ML 120 in response to a voltage level drop of ML 120. In other words, as voltage of ML 120 drops, voltage profile in time v(t) is smoothed out from a sharp slope to a gentle slope. In so doing, v(t) of the ML is made smooth and thus less abrupt. Consequently, the voltage level of ML during a ML discharge is prevented from dropping below the saturation level. As such, advantageously, less power is wasted in recovering the voltage level back to Vc in comparison with a conventional CAM.

As understood herein, the invention need not be limited to the matching convention described above. For example, in another embodiment having a different matching convention, ML 120 discharges in response to a data match rather than to a data mismatch. Also as understood herein, Vc does not need to be the supply voltage.

Figure 5:
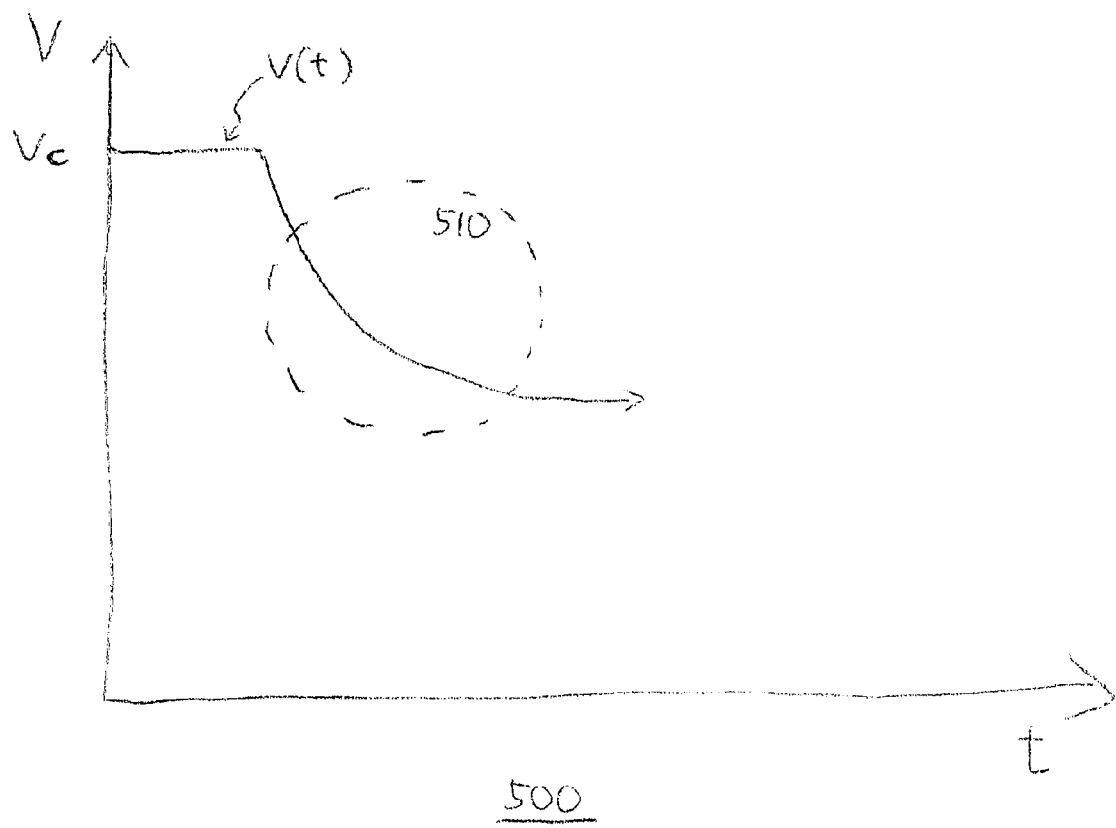
FIG. 5 is a graph (voltage vs. time) profiling a ML's voltage level variation in time in accordance with the embodiment of the invention shown in FIG. 4.

Referring now to FIG. 5, a graph 500 (voltage vs. time) is shown depicting the effect of smoothing out the slope of the voltage profile over time v(t) for a ML. Specifically, region 510 encloses the portion of the profile v(t) whose slope is becoming progressively flat due to the voltage profile smoothing effect of mechanism 410 shown in FIG. 4.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A CAM comprising:
   a comparator circuit coupled to a plurality of CAM cells, said comparator circuit adapted for comparing match data with stored data within said plurality of CAM cells;
   a match line (ML) coupled to said comparator circuit, said ML having its ML voltage level pre-charged to a pre-charge voltage level (Vc), wherein said ML voltage level drops from said Vc by a ML voltage swing (Vswing) in response to a data mismatch detected by said comparator; and
   a swing line (SL) coupled to said comparator circuit, said SL pre-charged to ground, wherein said SL charge shares with said ML in response to said data mismatch such that said Vswing is approximately less or equal to Vc/2.

2. The CAM of claim 1, wherein said ML has a ML capacitance Cml, and wherein said SL has a SL capacitance Csl, and wherein said Vswing depends on the ratio of Cml and Csl, and wherein said ratio of Csl to Cml is greater or equal to 1 for ensuring that Vswing is approximately less or equal to Vc/2.

3. The CAM of claim 1, wherein said comparator circuit comprises:
   a plurality of data lines coupled to said comparator circuit, said plurality of data lines adapted to provide match data for comparison with said stored data from said plurality of CAM cells.

4. The CAM of claim 1, further comprising:
   a pass gate coupled to said SL to regulate current flow on said SL; and
   a high resistance line having a first and a second terminals, said first terminal coupling to said ML, and said second terminal coupling to said pass gate, wherein in response to a voltage level drop of said ML, said pass gate decreases the voltage dropping rate of said ML by allowing less current to ground.

5. The CAM of claim 1, wherein said Vswing is approximately less or equal to Vc/2 irrespective of multiple data mismatches detected by said comparator circuit.

6. The CAM of claim 1, wherein a matching indication convention is adapted such that said ML voltage level drops from said Vc by a ML voltage swing (Vswing) in response to a data match rather than in response to a data mismatch; and
   wherein said SL charge shares with said ML in response to said data match such that said Vswing is approximately less or equal to Vc/2.

7. The CAM of claim 3, wherein said plurality of data lines are coupled respectively to a plurality of pass gates in said comparator circuit, and wherein said plurality of CAM cells are coupled respectively to a plurality of pass gates in said comparator circuit.

8. A method for managing power consumption of a CAM, said method comprising the steps of:
   pre-charging a ML of said CAM to a pre-charge voltage level Vc;
   pre-charging a SL of said CAM to ground, SL coupled to said ML; and
   limiting the voltage drop of said ML in response to a detected data mismatch by charge sharing between said ML and said SL as the voltage level of said ML drops in response to said detected data mismatch.

9. The method of claim 8, wherein in said limiting step said data mismatch is detected by a comparator circuit of said CAM between match data and stored data of said CAM, said comparator circuit coupled to both said ML and said SL.

10. The method of claim 9, wherein said comparator circuit comprises:
    a plurality of data lines coupled to said comparator circuit, said plurality of data lines adapted to provide said match data for comparison with said stored data from a plurality of CAM cells coupled to said comparator circuit.

11. The method of claim 8, wherein said ML has a ML capacitance Cml, and wherein said SL has a SL capacitance Csl, and wherein said Vswing depends on the ratio of Cml and Csl, and wherein said ratio of Csl to Cml is greater or equal to 1 for ensuring that the voltage drop of said ML is approximately less or equal to Vc/2.

12. The method of claim 8, further comprising the steps of:
    controlling rate of voltage drop of said ML in response to said detected data mismatch by regulating grounding of current flow on said SL by a pass gate coupled to said SL between said SL and ground.

13. The method of claim 12, wherein said regulating step comprises:
    communicating voltage drop of said ML to said pass gate via a high resistance line having a first and a second terminals, said first terminal coupled to said ML and said second terminal coupled to said pass gate; and in response to said pass gate detecting a voltage level drop of said ML communicated to said pass gate via said high resistance line, said pass gate decreasing the voltage dropping rate of said ML by allowing less current to ground from said SL.

14. The method of claim 8, wherein in said charge sharing step the dropping of said voltage level is approximately less or equal to Vc/2 irrespective of multiple data mismatches detected.

15. The method of claim 8, wherein a matching indication convention is adapted such that said ML voltage level drops from said Vc by a ML voltage swing (Vswing) in response to a data match rather than in response to a data mismatch, wherein said SL charge shares with said ML in response to said data match such that said Vswing is approximately less or equal to Vc/2, and wherein said limiting step is performed in response to said data match by charge sharing between said ML and said SL as the voltage level of said ML drops in response to said data match.

16. The method of claim 10, wherein said plurality of data lines are coupled respectively to a plurality of pass gates in said comparator circuit, and wherein said plurality of CAM cells are coupled respectively to a plurality of pass gates in said comparator circuit.

* * * * *